United States Patent
DenBaars et al.

(10) Patent No.: US 7,956,371 B2
(45) Date of Patent: Jun. 7, 2011

(54) HIGH EFFICIENCY LIGHT EMITTING DIODE (LED)

(75) Inventors: Steven P. DenBaars, Goleta, CA (US); Shuji Nakamura, Santa Barbara, CA (US); James S. Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 317 days.

(21) Appl. No.: 11/608,439

(22) Filed: Dec. 8, 2006

(65) Prior Publication Data

US 2007/0145397 A1  Jun. 28, 2007

Related U.S. Application Data

(60) Provisional application No. 60/748,480, filed on Dec. 8, 2005, provisional application No. 60/764,975, filed on Feb. 3, 2006.

(51) Int. Cl.
*H01L 33/38* (2010.01)

(52) U.S. Cl. ............... 257/98; 257/95; 257/E33.064; 257/E33.068

(58) Field of Classification Search ............... 257/98, 257/E33.072, 95, 10, E33.006, E33.056, 257/E33.061, E33.064, E33.065, E33.067, 257/E33.068; 313/501, 502
See application file for complete search history.

(56) References Cited

U.S. PATENT DOCUMENTS

| | | | | |
|---|---|---|---|---|
| 4,026,692 | A * | 5/1977 | Bartholomew | 65/30.12 |
| 4,497,974 | A | 2/1985 | Deckman et al. | |
| 6,155,699 | A | 12/2000 | Miller et al. | |
| 6,357,889 | B1 | 3/2002 | Duggal et al. | |
| 6,417,019 | B1 * | 7/2002 | Mueller et al. | 438/29 |
| 6,547,423 | B2 | 4/2003 | Marshall et al. | |
| 6,569,544 | B1 | 5/2003 | Alain et al. | |
| 6,573,537 | B1 | 6/2003 | Steigerwald et al. | |
| 6,717,362 | B1 * | 4/2004 | Lee et al. | 313/512 |
| 6,746,295 | B2 | 6/2004 | Sorg | |
| 7,053,419 | B1 | 5/2006 | Camras et al. | |
| 7,098,589 | B2 | 8/2006 | Erchak et al. | |
| 7,268,371 | B2 * | 9/2007 | Krames et al. | 257/98 |
| 7,719,020 | B2 | 5/2010 | Murai et al. | |
| 2002/0123204 | A1 | 9/2002 | Torvik | |
| 2003/0215766 | A1 * | 11/2003 | Fischer et al. | 433/29 |
| 2004/0079408 | A1 | 4/2004 | Fetzer et al. | |
| 2004/0211970 | A1 | 10/2004 | Hayashimoto et al. | |
| 2005/0029528 | A1 | 2/2005 | Ishikawa | |

(Continued)

FOREIGN PATENT DOCUMENTS

| | | |
|---|---|---|
| EP | 1081771 A2 | 3/2001 |
| WO | 2005083037 A1 | 9/2005 |

OTHER PUBLICATIONS

Liau, Z.L. et al., "Wafer fusion: A novel technique for optoelectronic device fabrication and monolithic integration," Appl. Phys. Lett. 1990, 56(8):737-739.

(Continued)

*Primary Examiner* — Evan Pert
*Assistant Examiner* — Eduardo A Rodela
(74) *Attorney, Agent, or Firm* — Gates & Cooper LLP

(57) ABSTRACT

An (Al, Ga, In)N light emitting diode (LED), wherein light extraction from chip and/or phosphor conversion layer is optimized. By novel shaping of LED and package optics, a high efficiency light emitting diode is achieved.

24 Claims, 16 Drawing Sheets

U.S. PATENT DOCUMENTS

| | | | |
|---|---|---|---|
| 2005/0082562 | A1 | 4/2005 | Ou et al. |
| 2005/0111240 | A1* | 5/2005 | Yonekubo ............... 362/617 |
| 2005/0156510 | A1* | 7/2005 | Chua et al. ............... 313/501 |
| 2005/0205884 | A1 | 9/2005 | Kim et al. |
| 2005/0243570 | A1* | 11/2005 | Chaves et al. ............ 362/551 |
| 2006/0202219 | A1* | 9/2006 | Ohashi et al. ............ 257/98 |
| 2006/0202226 | A1 | 9/2006 | Weisbuch et al. |
| 2007/0001186 | A1 | 1/2007 | Murai et al. |
| 2007/0102721 | A1 | 5/2007 | DenBaars et al. |
| 2007/0120135 | A1 | 5/2007 | Soules et al. |

OTHER PUBLICATIONS

Kish, F.A. et al., "Very high-efficiency semiconductor wafer-bonded transparent-substrate (AlxGa1-x)0.5In0.5P/GaP light-emitting diodes," Appl. Phys. Lett. 1994, 64(21):2839-2841.

Jasinski, J. et al., "Microstructure of GaAs/GaN interfaces produced by direct wafer fusion," Appl. Phys. Lett. 2002, 81(17):3152-3154.

Murai, A. et al., "Wafer Bonding of GaN and ZnSSe for Optoelectronic Applications," Jpn. J. Appl. Phys. 2004, 43 (10A):L1275-L1277.

Fujii, T. et al., "Increase in the extraction efficiency of GaN-based light-emitting diodes via surface roughening," Appl. Phys. Lett. 2004, 84(6):855-857.

International Search Report filing date Jun. 16, 2006, International application No. PCT/US06/23588.

International Search Report filing date Nov. 6, 2006, International application No. PCT/US06/43317, mailing date Jul. 31, 2008.

International Search Report filing date Dec. 8, 2006, International application No. PCT/US2006/047008, mailing date Nov. 1, 2007.

* cited by examiner

HIGH EFFICIENCY LIGHT EMITTING DIODE (LED)

CROSS-REFERENCE TO RELATED APPLICATIONS

This application is related to the following co-pending and commonly-assigned applications:

U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS AND ITS FABRICATION METHOD,";

U.S. Provisional Application Ser. No. 60/732,319, filed on Nov. 1, 2005, by Akihiko Murai, Christina Ye Chen, Daniel B. Thompson, Lee McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,";

U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS AND ITS FABRICATION METHOD,";

U.S. Provisional Application Ser. No. 60/734,040, filed on Nov. 11, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),"; and all of which applications are incorporated by reference herein.

This application claims the benefit under 35 U.S.C. Section 119(e) of the following co-pending and commonly-assigned U.S. patent applications:

U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),"; and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

both of which applications are incorporated by reference herein.

BACKGROUND OF THE INVENTION

1. Field of the Invention

This invention is related to light emitting diode (LED) light extraction for optoelectronic applications.

2. Description of the Related Art

Wafer bonding technology using different combinations of materials, such as InP/GaAs, AlGaInP/GaP, GaAs/GaN, ZnSSe/GaN, has been studied for applications of optoelectronic integration, light emitting diodes (LEDs), vertical cavity surface emitting lasers (VCSELs), and electronic devices (Appl. Phys. Lett. 56, 737-39 (1990); Appl. Phys. Lett. 64, 2839-41 (1994); Appl. Phys. Lett. 81, 3152-54 (2002); and J. J. Appl. Phys. 43, L1275-77 (2004)).

In a nitride LED system, there are several reports of fabricating transparent electrodes on a p-type GaN layer. The general method is to use thin metals of Ni and Au (J. J. Appl. Phys. 34, L797-99 (1995)). Because of the light absorption in the metal, transmittance is only around 60%. Also, surface feature shaping for improving light extraction efficiency is difficult because of the hardness of GaN material and the instability of p-type GaN conductivity.

Another approach is to use ZnO layer growth on p-type GaN (J. J. Appl. Phys. 43, L180-82 (2004)). However, this method requires ZnO crystal growth equipment, which uses ultra-high vacuum conditions. Moreover, it is difficult to grow thick layers, e.g., 500 μm thick layers, that are suitable for feature shaping for the purpose of light extraction.

SUMMARY OF THE INVENTION

The present invention describes an (Al, Ga, In)N and ZnO direct wafer bonded light emitting diode (LED) combined with a shaped plastic optical element and a phosphor down-conversion layer.

In summary, the present invention comprises optical devices, usually Light Emitting Diodes (LEDs), that emit multiple wavelengths of light, typically comprising white light. Such devices are usually higher efficiency than comparable devices.

An optical device in accordance with the present invention comprises a III-nitride light emitting region comprised of at least an active region, at least one first shaped optical element wafer bonded to at least one side of the III-nitride light emitting region, at least one second shaped optical element encapsulating both the III-nitride light emitting region and the at least one first shaped optical element for extracting light emitted by the LED and the first shaped optical elements, and a phosphor, optically coupled to the at least one second shaped optical element, wherein light in at least a first wavelength region emitted by the III-nitride light emitting region passes through the at least one second shaped optical elements and excites the phosphor to emit light in at least a second wavelength region.

Such an optical device further optionally includes at least one of the at least one first shaped optical elements comprising a n-type ZnO optical element, at least one of the at least one first shaped optical elements being shaped to increase light extraction from the III-nitride light emitting region, at least one first shaped optical element including angles adjusted for light extraction efficiency from the III-nitride light emitting region, at least one of the at least one first shaped optical elements being cone-shaped and the at least one second shaped optical element comprising a lens.

The optical device can further optionally include the at least one second shaped optical element being shaped for light extraction the at least one second shaped optical element including angles that are adjusted for light extraction efficiency, a layer forming an interface between the III-nitride light emitting region and the at least one first shaped optical elements having a roughened surface, an additional phosphor layer coupled to the phosphor layer, a third shaped optical element encapsulating the optical device, the at least one first shaped optical elements and the at least one second shaped optical elements for extracting light emitted by the LED, the first shaped optical elements, and the second shaped optical elements, the third shaped optical element comprising a reflector cup, and the phosphor layer being shaped for light extraction efficiency.

The optical device can also include the III-nitride light emitting layer comprises at least one of the group consisting of: (Al, Ga, In)N materials, (Al, Ga, In)As materials, (Al, Ga, In)P materials, compound semiconductor material from (Al, Ga, In)AsPNSb materials, and compound semiconductor material from $ZnGeN_2$ or $ZnSnGeN_2$ materials, a reflective coating coupled to the at least one first optical element, a reflector positioned between the phosphor layer and the III-nitride light emitting region which passes at least the first wavelength region and reflects at least a portion of light in the second wavelength region, and the reflector being a distributed Bragg reflector.

Another embodiment of the present invention is a Light Emitting Diode assembly. Such an assembly in accordance with the present invention comprises a substrate, a light emitting device, comprising an n-type Group III nitride layer coupled to the substrate, an active layer, coupled to the n-type Group III nitride layer, wherein the active layer emits light in at least a first wavelength region, and a p-type Group III nitride layer, coupled to the active layer, at least one oxide layer, coupled to the light emitting device, the at least one oxide layer being shaped into a form that increases the efficiency of the light emitting device by reducing light absorption in the light emitting device, an optical element, coupled to the at least one oxide layer, and a phosphor, optically coupled to the at least one oxide layer, wherein light in at least the first wavelength region emitted by the light emitting device passes through the phosphor and excites the phosphor to emit light in at least a second wavelength region.

Another embodiment of the present invention is a Light Emitting Diode (LED) emitting multiple wavelength regions of light, which comprises an active Group III nitride layer, wherein the active Group III nitride layer emits light in at least a first wavelength region, at least one oxide layer, coupled to the light emitting device, wherein the at least one oxide layer is substantially transparent in the first wavelength region, the at least one oxide layer being shaped into a form that increases the efficiency of the LED by reducing light absorption in the LED, and a phosphor, optically coupled to the at least one oxide layer such that light in at least the first wavelength region strikes the phosphor and excites the phosphor to emit light in at least a second wavelength region, such that light in at least the first wavelength region and the second wavelength region are emitted by the LED.

Such an embodiment further optionally includes a lens, coupled between the oxide layer and the phosphor, wherein the lens increases the efficiency of the LED by reducing light absorption in the LED.

Other features and advantages are inherent in the system disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of the present invention is to provide a means of increasing the light extraction efficiency from a light emitting diode (LED) by combining shaped high refractive index elements with an (Al, Ga, In)N LED and shaped optical elements. By increasing light transmittance and light extraction, subsequent device performance is increased.

In one embodiment of the present invention, a high refractive index ZnO layer is wafer bonded to a GaN LED. A cone is etched in the high refractive index ZnO layer and contacts are fabricated on the GaN LED. The ZnO/GaN hybrid LED is then placed within various configured lenses and covered by a phosphor layer for high efficiency light extraction.

Technical Description

Figure 1:
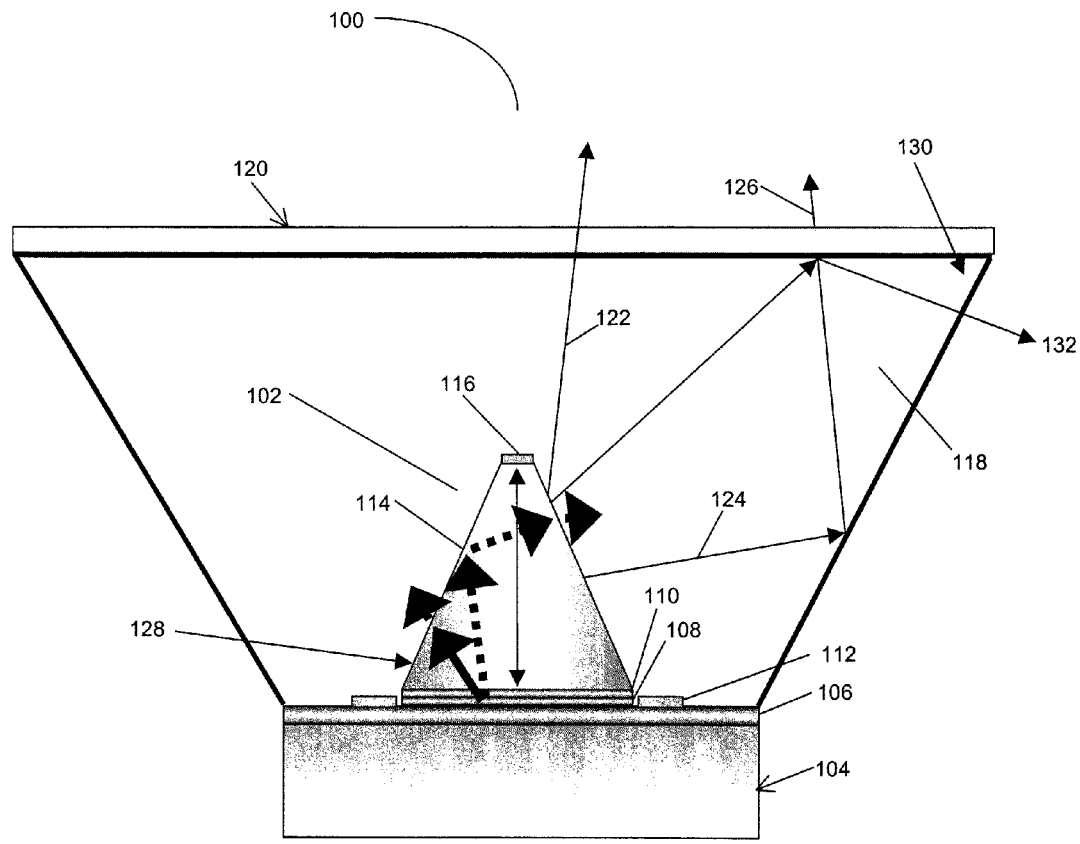
FIG. 1 shows a schematic representation of a high light extraction efficiency light emitting diode according to the preferred embodiment of the present invention.

FIG. 1 shows a schematic representation of a high light extraction efficiency LED 100 according to the preferred embodiment of the present invention. Generally, the LED 100 is an (Al, Ga, In)N and ZnO direct wafer-bonded LED structure. In this example, one or more III-nitride LEDs 102 on a sapphire substrate, wherein the III-nitride LED 102 comprises an n-type III-nitride layer 106, an active layer 108, and a p-type III-nitride layer 110. One or more n-type electrodes 112 or contacts may reside on the III-nitride LED 102.

One or more, or at least one, n-type ZnO cones 114 having a typical index of refraction of $n_0$=2.1 reside on top of the LED 102, with a p-type electrode 116 or contact on top of the n-type ZnO cone 114. Both the LED 102 and the n-ZnO cones 114 are encapsulated within or under one or more tapered or conical plastic lenses 118 having an index of refraction of $n_{encap}=1.5$. However, additional cones 114, made of different materials and/or different shapes, such as pyramidal, conical, hexagonal, hemispherical, or other shapes, can be used on the same LED 102 without departing from the scope of the present invention.

Consequently, this figure illustrates the concept of the present invention of providing for high efficiency light extraction by combining an (Al, Ga, In)N based LED 102, one or more first "shaped" optical elements (e.g., the n-ZnO cone 114) of higher refractive index that are adjacent to, on the surface of, or surrounding the (Al, Ga, In)N LED 102, and one or more second "shaped" optical elements (e.g., the lens 118) of lower refractive index that encapsulate both the (Al, Ga, In)N LED 102 and the first shaped optical elements 114.

The top (opposite the side in contact with the LED 102) of the n-ZnO cone 114 is shaped to obtain the highest light extraction efficiency. Moreover, the n-ZnO cone 114 may have a highly reflective coating to guide light, through reflections, toward the top of the cone 114, which is uncoated. In addition, the top of the n-ZnO cone 114 is in direct contact with the conical plastic lens 118 to obtain the highest light extraction efficiency.

The critical angles $\Theta c$ of the n-ZnO cone 114 and conical plastic lens 118 may be adjusted as desired. If the critical angle $\Theta c$ is approximately 60°, most light emitted by the LED 102 makes it out of the cone 114 on the first pass, since the majority of the light is within the escape cone.

In addition, a remote phosphor layer 120 may be placed on top of the plastic lens. In this embodiment, the phosphor layer 120 is a down-conversion layer, however, the phosphor layer 120 can be an up-conversion layer, or can be both an up-conversion layer and a down-conversion layer. The phosphor layer 120 may be shaped in a manner similar to the first and second shaped optical elements to enhance light extraction efficiency.

In addition, a mirror or reflector layer may be placed on the backside of the substrate 104, in order to reflect light and enhance extraction efficiency.

As light 122 escapes from cone 114, light 122 strikes phosphor layer 120. Typically, the wavelength of light 122 is in the blue or ultraviolet region, and escapes from LED 100 as blue or ultraviolet light. However, as light 124 strikes phosphor 120, the blue/ultraviolet light 124 is down-converted to yellow light 126. As such, both blue light 122 and yellow light 126 emit from LED 100, which thus produces white light.

LED 102 can produce other colors of light other than blue/ultraviolet light. By properly doping the LED 102, green, red, and blue light can be produced, or other colors, and by designing LED assembly 100 with the proper emissions from LED 102 and the desired additional colors of light present by exciting phosphor layer 120, LED 100 can produce white light by other combinations besides blue and yellow light.

Angle 128, which defines the shape of cone 114, and angle 130, which defines the edge and top surface of lens 118, can be adjusted to increase light emission. Angle 128 is adjusted to increase the light emission from LED 102; angle 130 increase the light emission from the lens 118. Although these angles 128 and 130 are typically the same numerical value, e.g., approximately 60 degrees, angles 128 and 130 may vary from this typical value and vary from each other depending on the material being used for LED 102, the material being used for cone 114, the material being used for lens 118, as well as the wavelength of light that is being emitted from LED 102 and striking the top surface of lens 118. All of these angles are within the scope of the present invention, and the approximately 60 degree angle shown in the figures is merely for purposes of illustration and not meant to limit the present invention. Even with the changes in angles 128 and 130, there is typically some light 132 that is reflected from the top surface of lens 118 and reflected back into lens 118.

Figure 2:
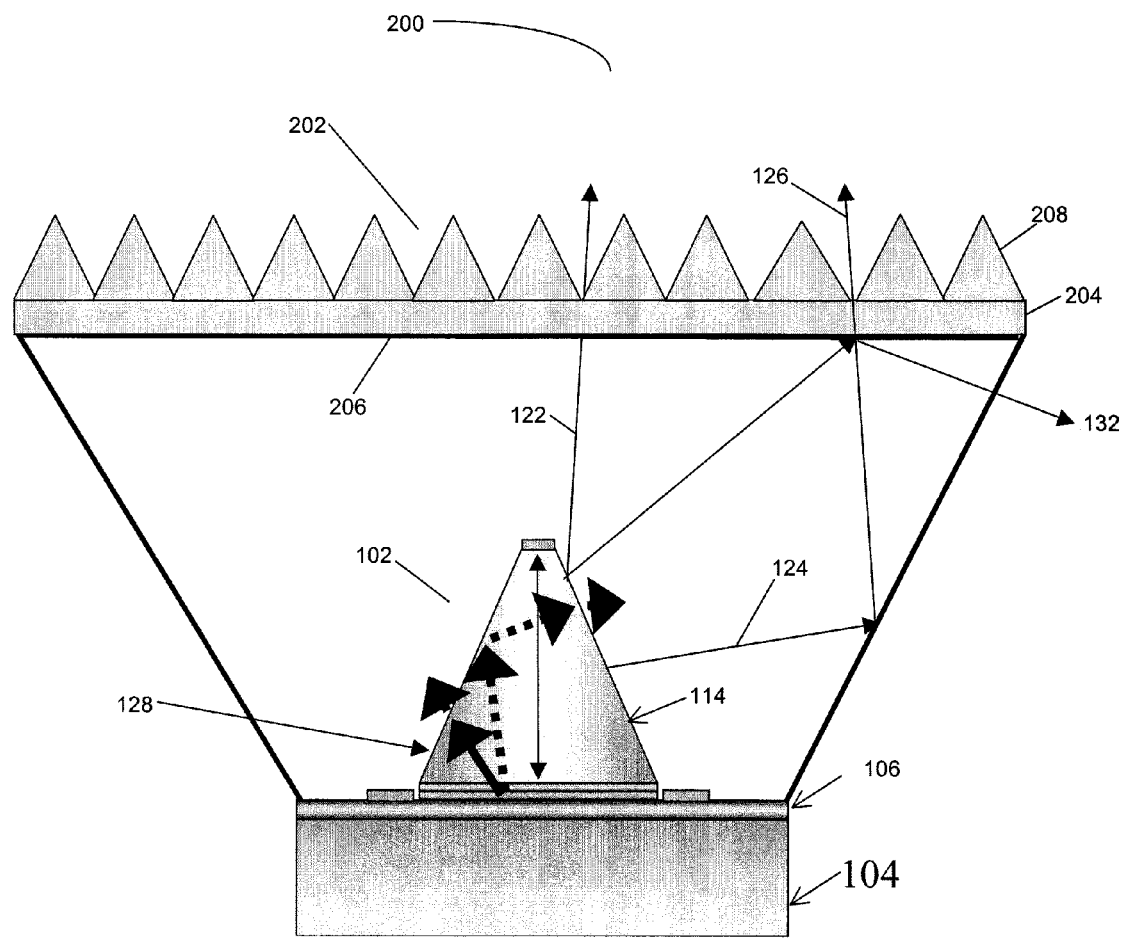
FIG. 2 is a variation of FIG. 1 showing the cone-shaped LED with a remotely-located phosphor down-conversion layer in a high index layer.

FIG. 2 is a variation of FIG. 1 that combines the cone-shaped LED 200 with a remotely-located phosphor down-conversion layer 202 in a high index layer 204. In this embodiment, the phosphor down-conversion layer 202 is shaped for maximum light extraction efficiency, wherein the lower surface 206 of the high index layer (facing the LED) is smooth and the phosphor down-conversion layer is shaped on outer surface 208 to obtain the highest light extraction efficiency for the down-converted light 126 and pump (LED) light 122. Specifically, in this embodiment, the phosphor layer 202 is a white light conversion layer shaped as a plurality of cones or pyramids for the highest possible light extraction efficiency.

Figure 3:
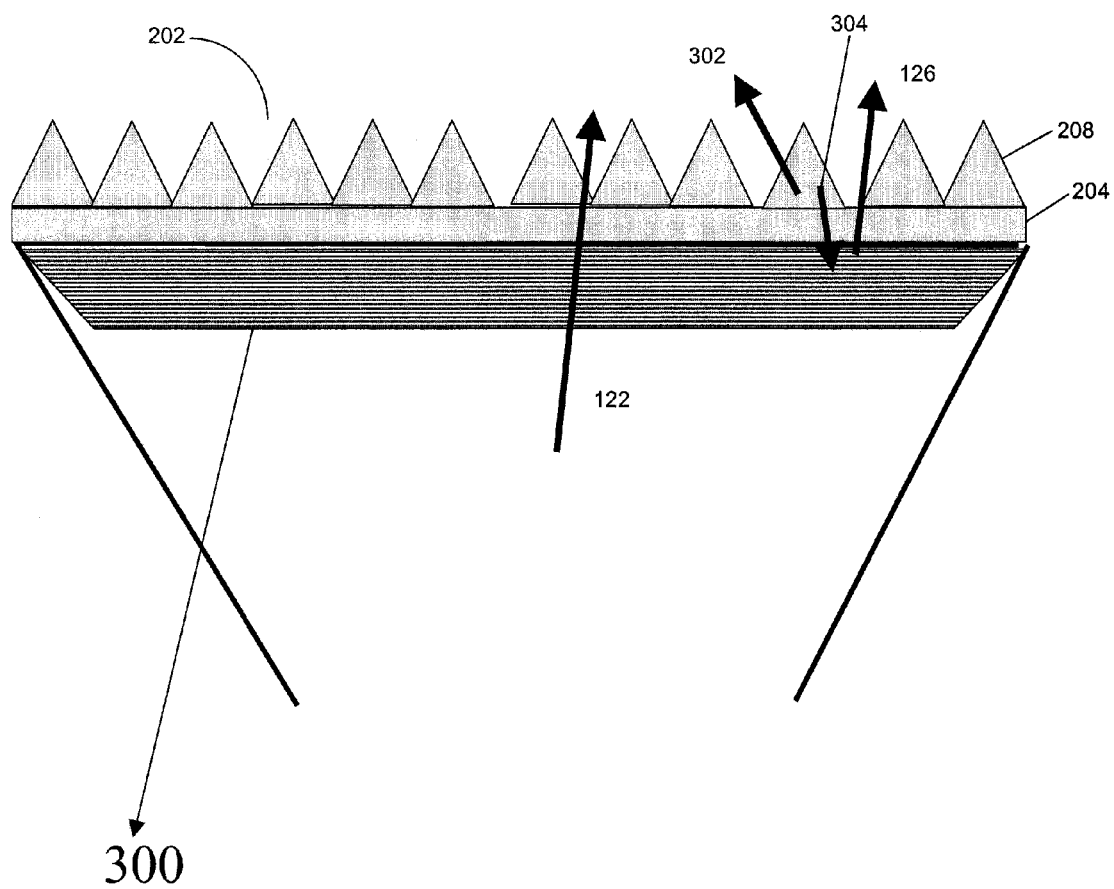
FIG. 3 is a variation of FIG. 2 showing the shaped white light conversion layer with a distributed Bragg reflector (DBR) on the backside of the phosphor layer.

FIG. 3 is a variation of FIG. 2 that combines the shaped white light conversion layer 204 with a distributed Bragg reflector (DBR) 300 on the backside of the phosphor layer 202, in order to reflect yellow, red, or green light, but to allow blue-ultraviolet (UV) pumped light 122 to pass. Specifically, the DBR 300 can be tuned to reflect light in the red through green spectrum, while passing light in the blue through UV spectrum. Additionally, the shaped surface 208 of phosphor 202 can refract some wavelengths of light 302, while reflecting other wavelengths 304, which can assist DBR 300, or perform some of the reflections of light that would make DBR 300 easier to manufacture. Designs for the phosphor layer 202 and DBR 300 can complement each other to increase efficiency of the overall device.

Figure 4:
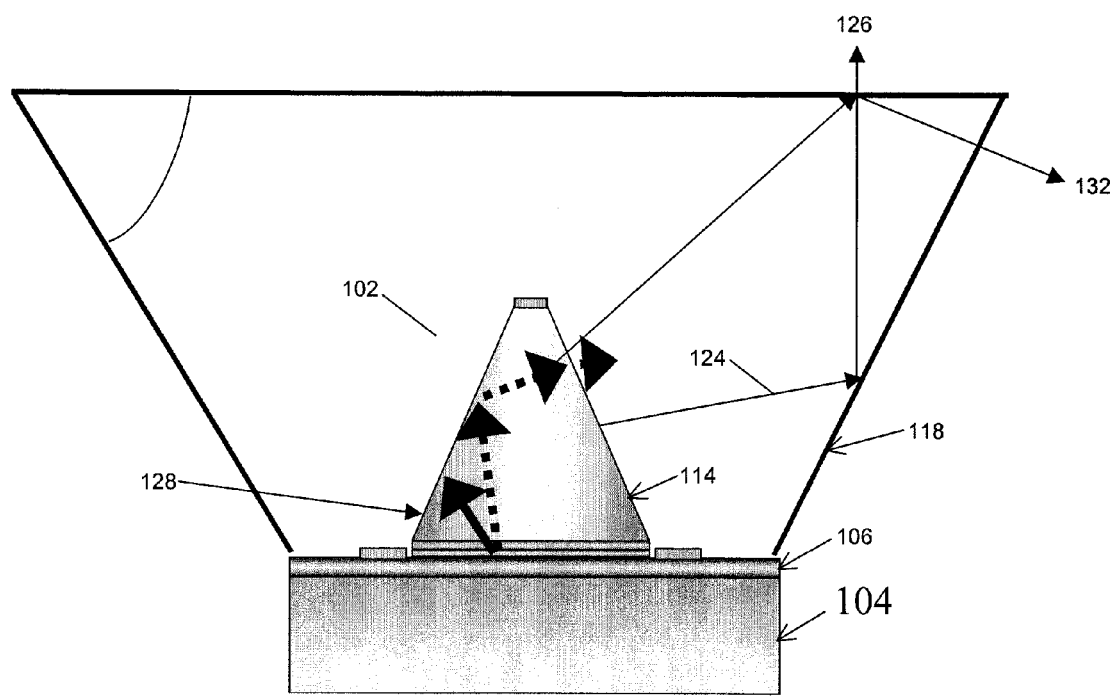
FIG. 4 illustrates the cone-shaped optical element of the present invention.

FIG. 4 illustrates that, for an approximately 60 degree angle 128 cone 114, most of the light 124 makes it out on the first pass, since the majority of the light is within the escape cone. Examples, of the materials that may be used, with their different indices of refraction and critical angles, is provided below:

Air/plastic=1/1.5, $\Theta c=42°$,
Plastic/ZnO=1.5/2.1, $\Theta c=46°$,
ZnO/GaN=2.1/2.3, $\Theta c=66°$, and
Air/ZNO=1/2.1, $\Theta c=28°$.

Other materials and angles can be used without departing from the scope of the present invention.

Figure 5:
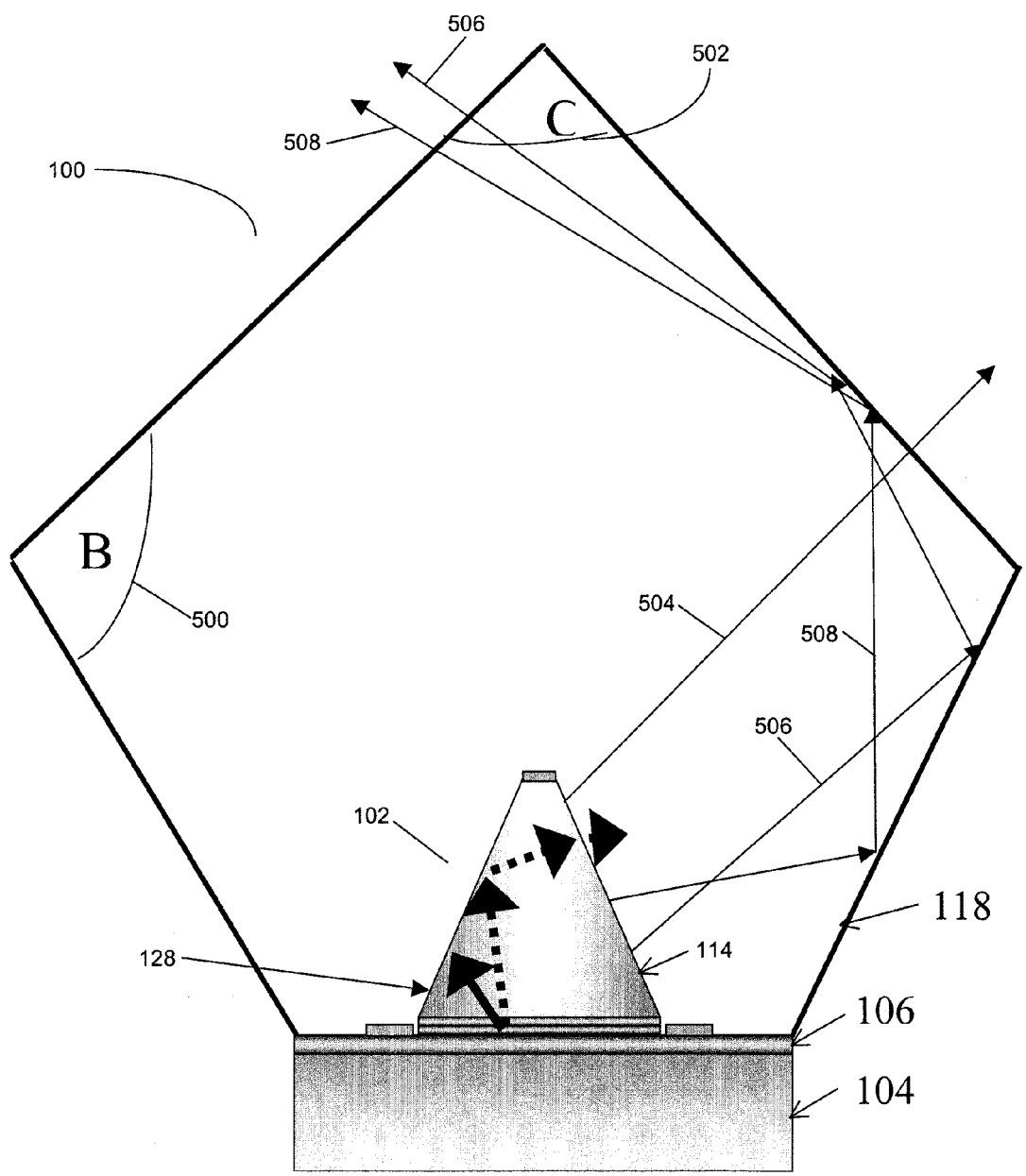
FIG. 5 is a variation of FIG. 1 with a different shaped lens and no phosphor layer.

FIG. 5 is a variation of FIG. 1 with a differently shaped lens and no phosphor layer.

As shown in FIG. 5, rather than have light 132 reflect back into lens 118, thus reducing the brightness and/or efficiency of device 100, lens 118 can take on a shape that maximizes the light emission from device 100. Angles B 500 and C 502 are selected to maximize the light emission of light 504-508 from device 100. Angles B 500 and C 502 can change based on the materials used for cone 114, lens 118, and angle 128, as well as the frequency of light emitted by LED 102.

Figure 6:
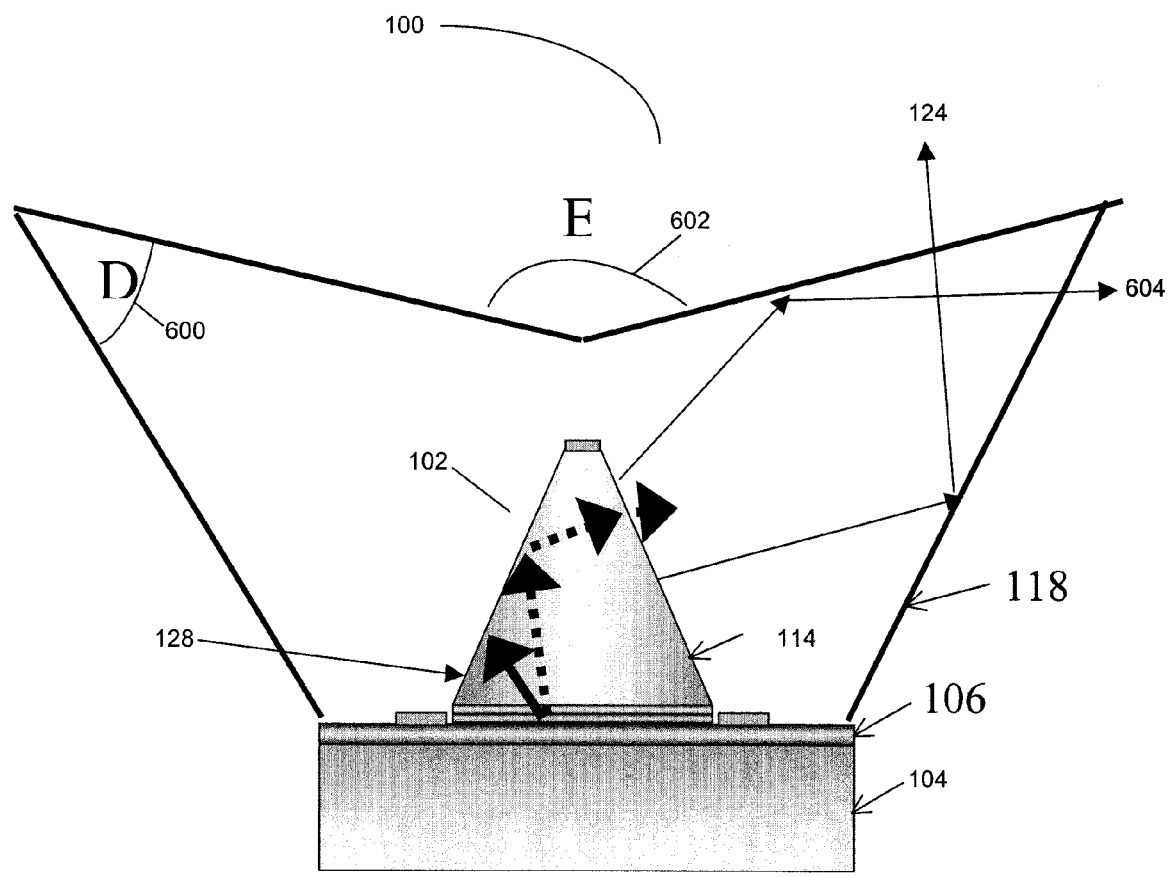
FIG. 6 is a variation of FIG. 1 with a different shaped lens and no phosphor layer.

FIG. 6 is a variation of FIG. 1 with a differently shaped lens and no phosphor layer.

Other surface profiles for lens 118 can also be used, where angles D 600 and E 602 will allow light 124 to emit from the top surface of lens 118, while other light 604 will reflect and emit from the side of lens 118. As seen in FIGS. 5 and 6, many possible geometries for lens 118 are possible within the scope of the present invention.

Figure 7:
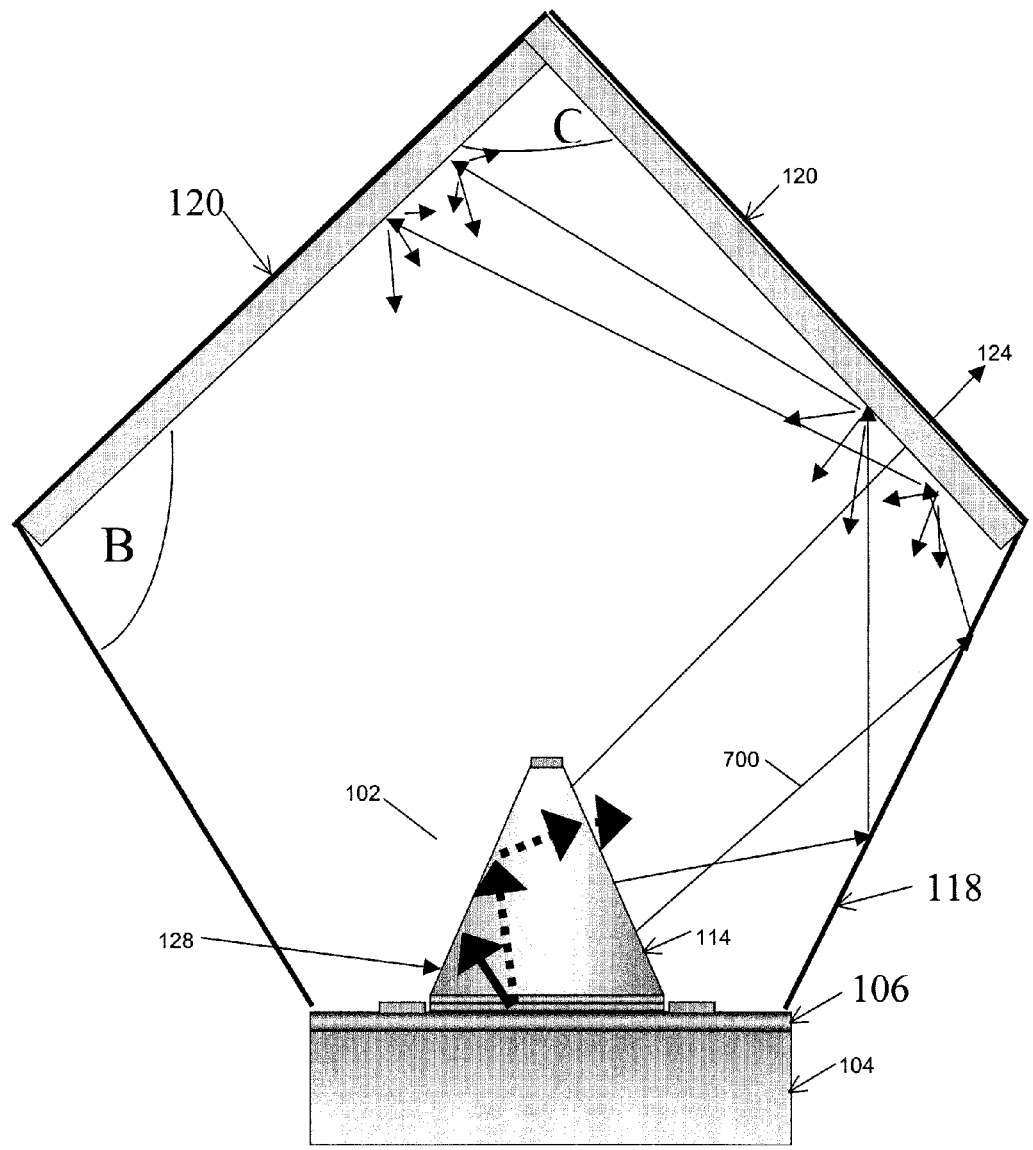
FIG. 7 is a variation of FIG. 5 with a phosphor layer on the two top sides of the lens.

FIG. 7 is a variation of FIG. 5 with a phosphor layer on the two top sides of the lens.

With the addition of phosphor layer 120 to the upper surfaces of lens 118, light 124 now has the opportunity to escape directly, as well as having light 700 excite phosphor 120 in multiple places during reflections within lens 118. Some of light 700 will also escape from lens 118, but the multiple reflections of light 700 from phosphor 120 will provide additional down-conversion or up-conversion of light 700 to other wavelengths.

Figure 8:
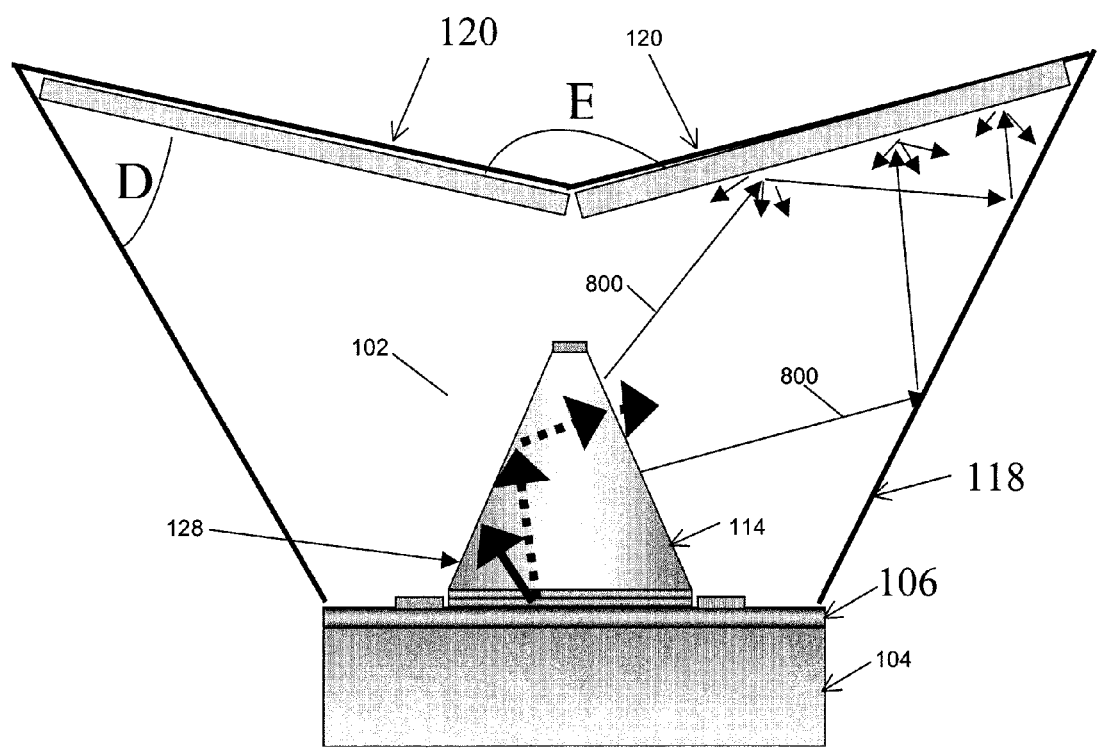
FIG. 8 is a variation of FIG. 6 with a phosphor layer on the two top sides of the lens.

FIG. 8 is a variation of FIG. 6 with a phosphor layer on the two top sides of the lens. As with FIG. 7, light 800 now also has multiple opportunities to excite phosphor layer 120 within lens 118. This will provide wavelength balancing or wavelength preferences as needed to provide white light, or, if desired, the LED 102 can be tuned to emit certain wavelengths based on the characteristics of phosphor 120 and the shape of lens 118. For example, and not by way of limitation, the shape of lens 118 and characteristics of phosphor 120 can be tuned to provide a certain "color" of white light, e.g., "warm" light, by designing assembly 100 to produce a certain number of reflections and emissions to emulate the warm light.

Figure 9:
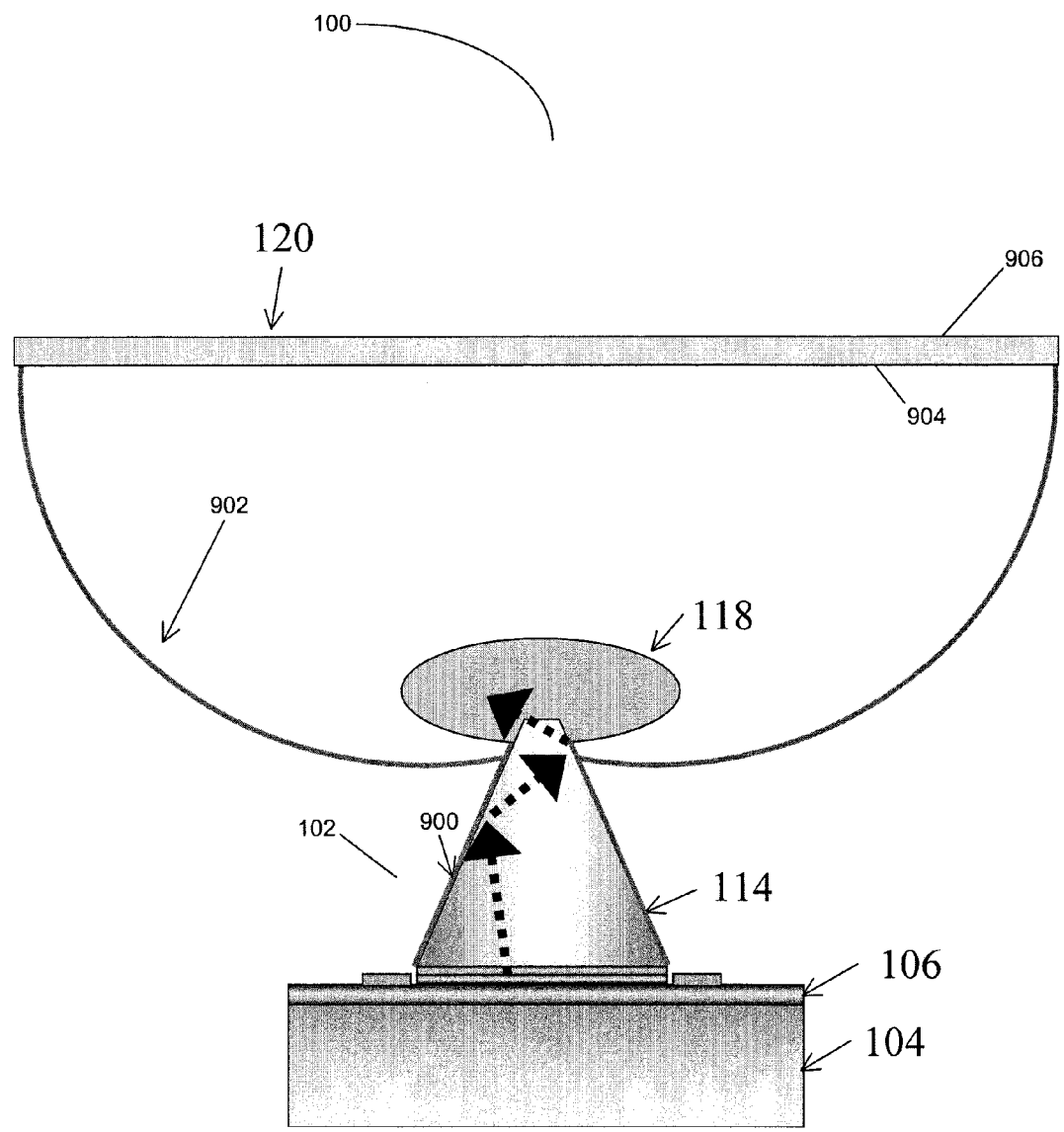
FIG. 9 shows a schematic representation of a high light extraction efficiency LED according to the preferred embodiment of the present invention.

FIG. 9 shows a schematic representation of a high light extraction efficiency LED according to the preferred embodiment of the present invention.

In this embodiment, which includes both the LED 102 with an n-type ZnO cone 114, a reflective coating 900 is applied to the side of the n-ZnO cone, a spherical plastic lens is positioned on top of the n-ZnO cone, and the lens and top of the n-ZnO cone are encapsulated within a reflector cup, which is a third "shaped" optical element. The highly reflective coating 900 on the n-ZnO cone 114 guides light, through reflections, toward the top of the cone 114, which is uncoated, wherein the top of the n-ZnO cone 114 is surrounded by the reflector cup 902.

In addition, a phosphor plate 120 is placed on top of the reflector cup 900. The phosphor plate 120 is a remotely located phosphor down-conversion layer comprised of phosphor embedded in a high index layer. The lower surface 904 of the high index layer (facing the LED) is smooth and the top surface 906 of the high index layer is rough, so as to obtain the highest light extraction efficiency from the down-conversion layer 120.

Figure 10:
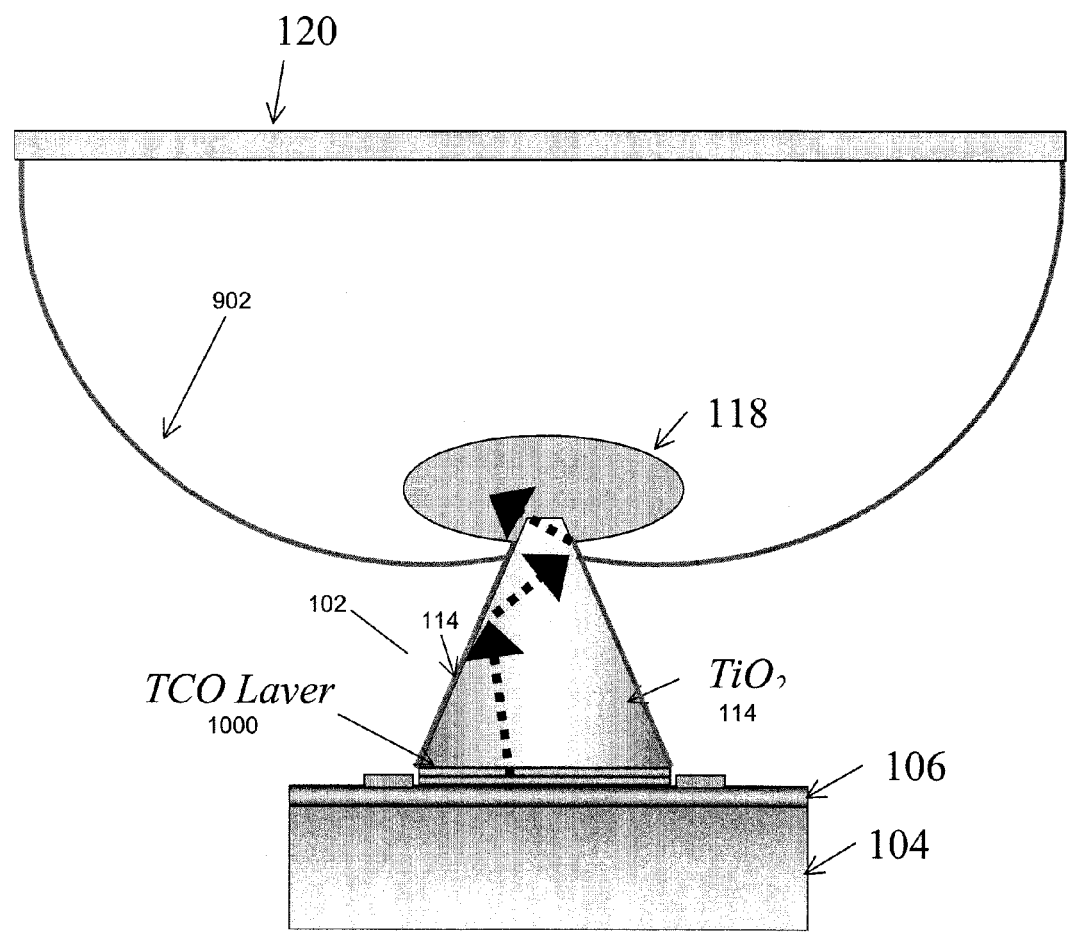
FIG. 10 is a variation of FIG. 9, wherein the phosphor plate placed on top of the reflector cup includes a roughened side and a smoothed side to assist in light extraction.

FIG. 10 is a variation of FIG. 9, wherein the phosphor plate placed on top of the reflector cup includes a roughened side and a smoothed side to assist in light extraction. Also in this embodiment, a transparent conducting oxide (TCO) layer 1000, which can be made from Indium Tin Oxide (ITO), Zinc Oxide (ZnO), and/or other materials that are transparent or mostly transparent in the wavelength region of interest is positioned between the LED 102 and the n-type ZnO cone 114, wherein the n-type ZnO cone 114 is made from an insulating high index material, such as Titanium Dioxide ($TiO_2$).

Figure 11:
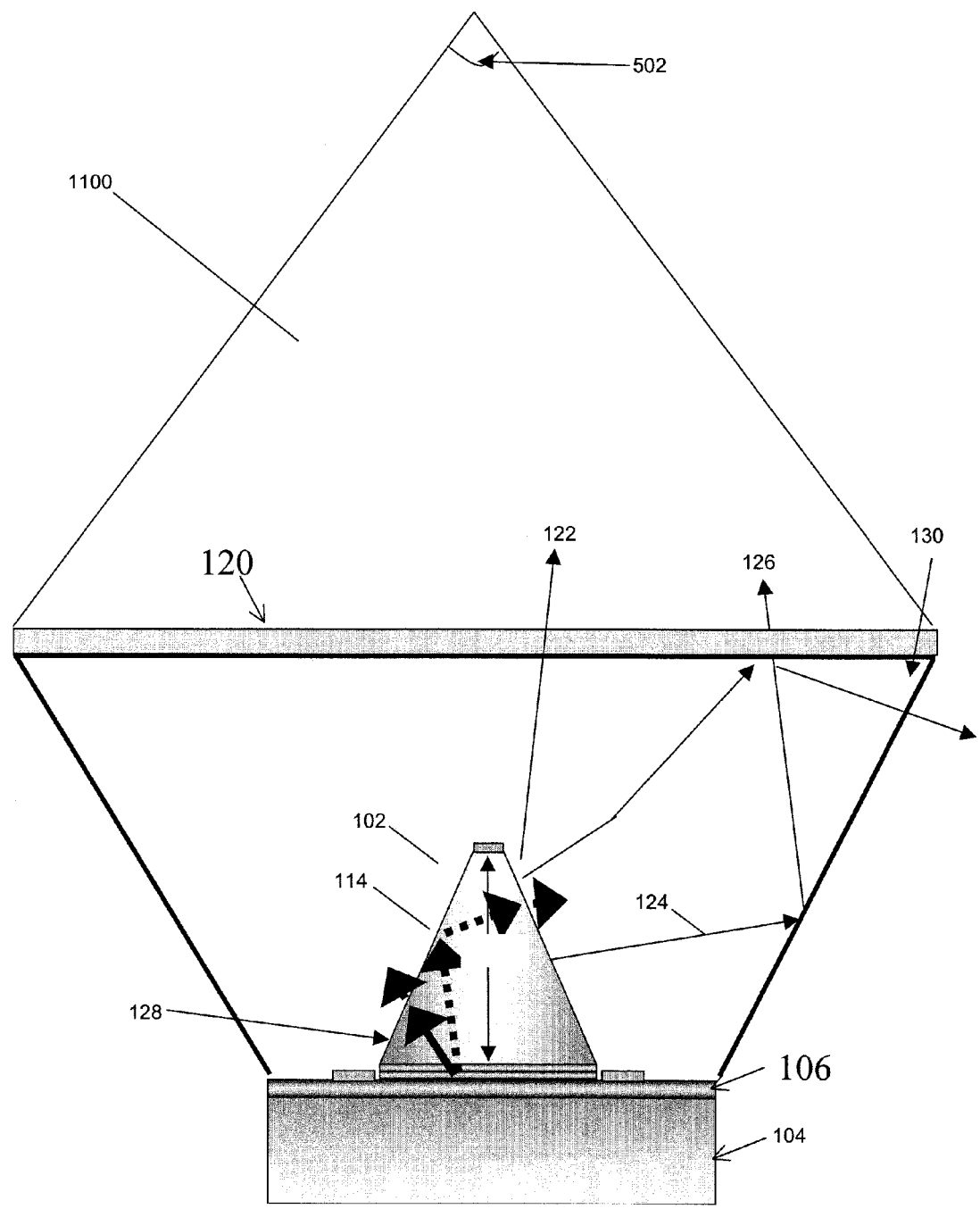
FIG. 11 shows a schematic representation of a multi-cone LED according to the preferred embodiment of the present invention.

FIG. 11 shows a schematic representation of a multi-cone LED according to the preferred embodiment of the present invention. Specifically, a top cone 1100, which acts as a third shaped optical element, resides on top of the phosphor layer 120.

Figure 12:
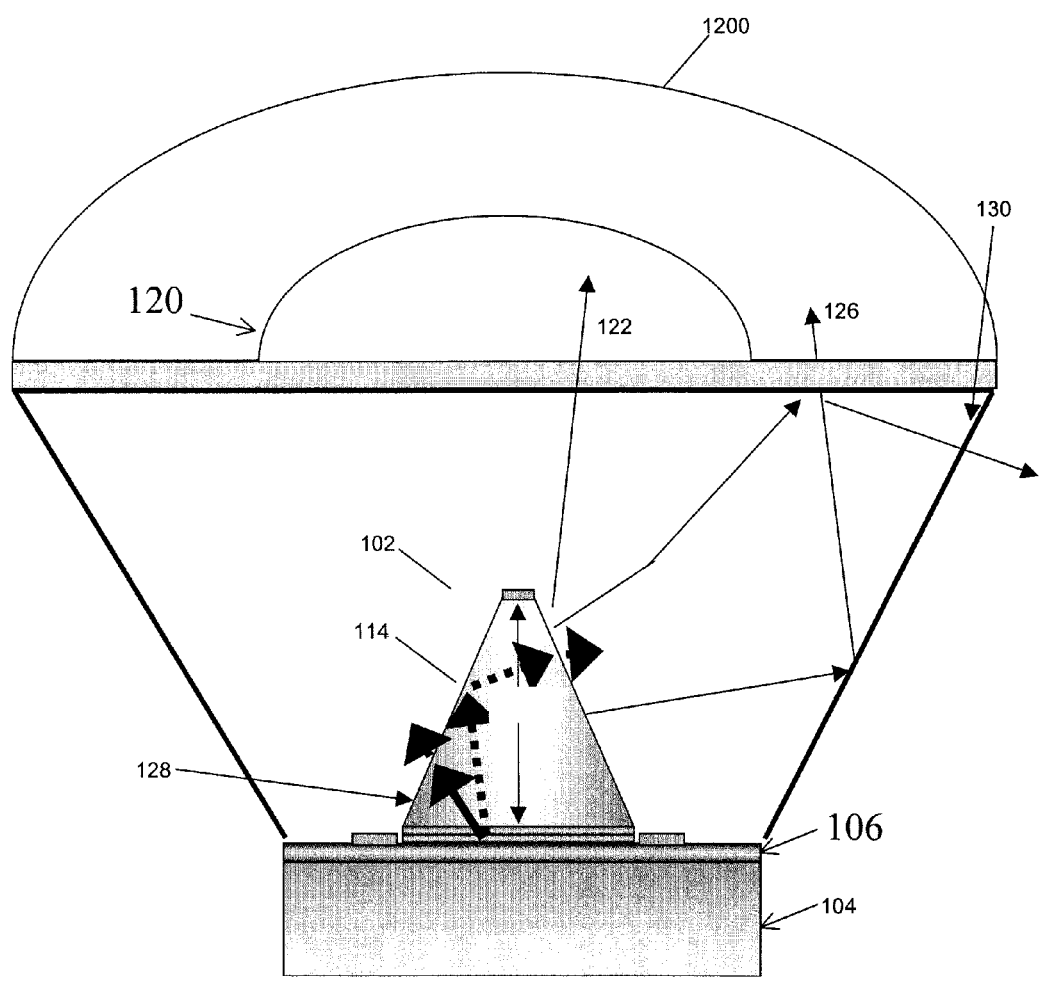
FIG. 12 shows a schematic representation of a multi-shape LED according to the preferred embodiment of the present invention.

FIG. 12 shows a schematic representation of a multi-shape LED according to the preferred embodiment of the present invention. Specifically, a plurality of phosphor layers, e.g. layers 120 and 1200, are shown, wherein a second phosphor layer 1200 encapsulates a first phosphor layer 120.

Figure 13:
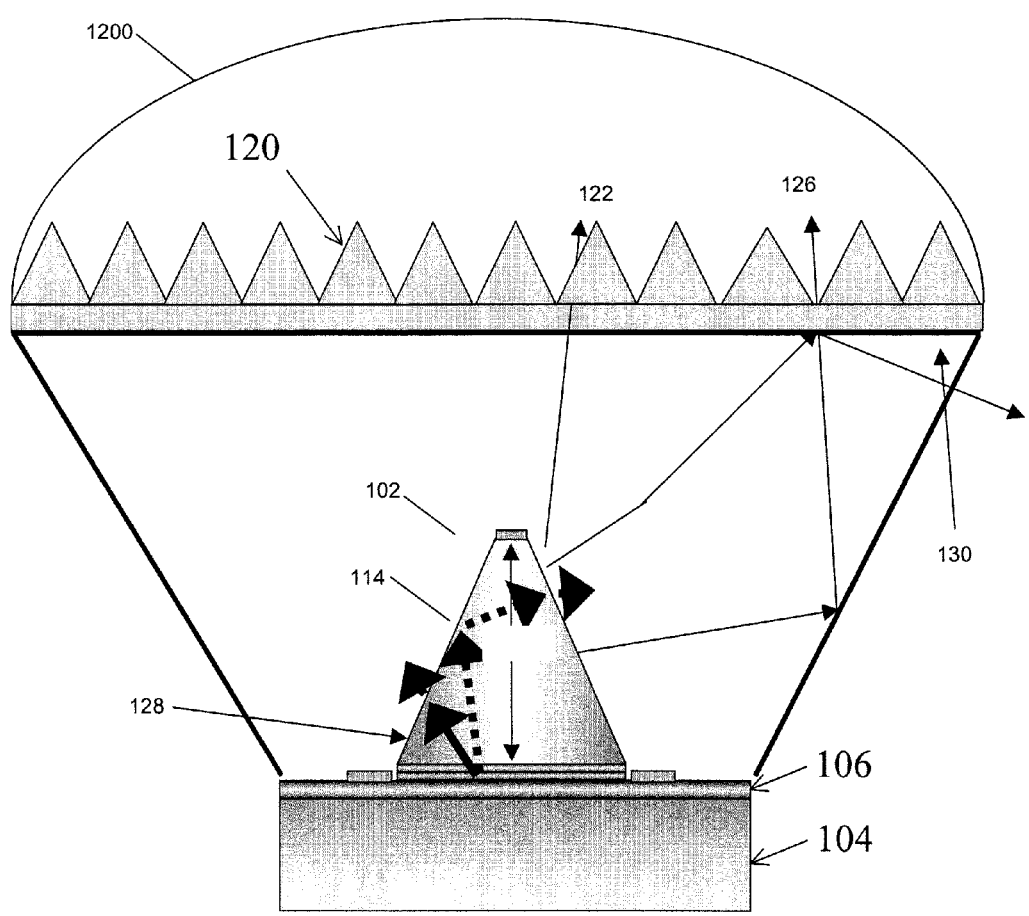
FIG. 13 shows a schematic representation of a multi-shape LED according to the preferred embodiment of the present invention.

FIG. 13 shows a schematic representation of a multi-shape LED according to the preferred embodiment of the present invention. Specifically, a plurality of phosphor layers, layer 120 and layer 1200 are shown, wherein a second phosphor layer 1200 encapsulates a first phosphor layer 120 and the first phosphor layer 120 comprises a plurality of cones.

Figure 14:
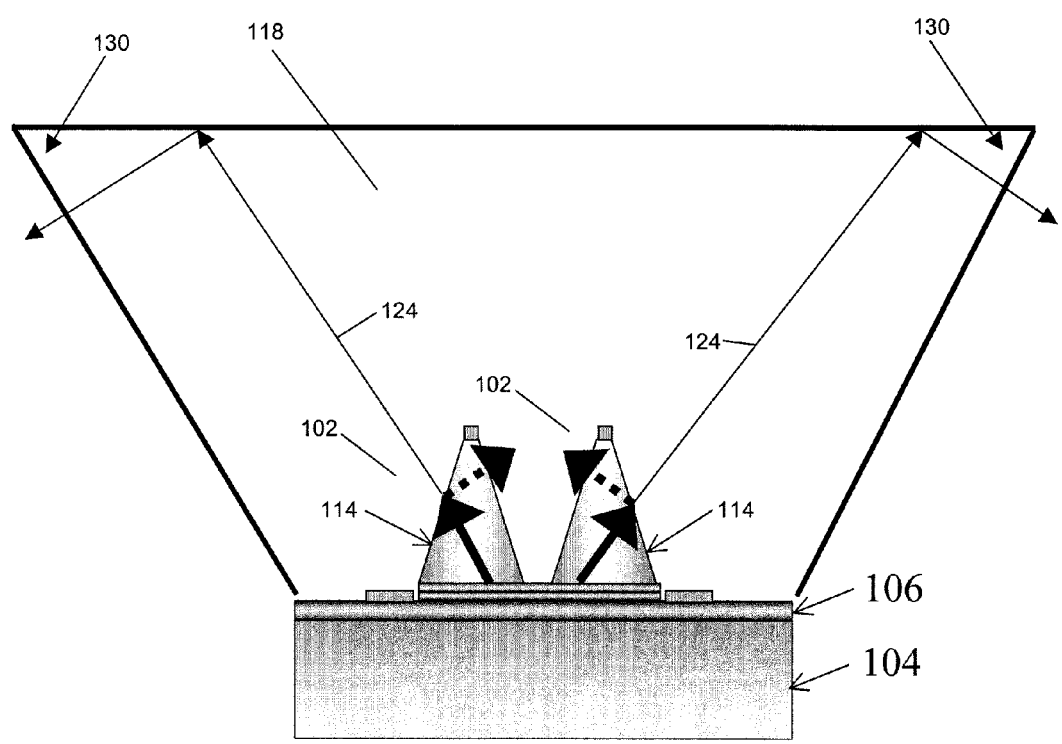
FIG. 14 shows a schematic representation of a multi-shape LED according to the preferred embodiment of the present invention.

FIG. 14 shows a schematic representation of an LED according to the preferred embodiment of the present invention. Specifically, a plurality of first "shaped" optical elements (e.g., the n-ZnO cones 114) of higher refractive index are adjacent to, on the surface of, or surrounding one or more (Al, Ga, In)N LEDs 106, wherein one or more second "shaped" optical elements (e.g., the lens 118) of lower refractive index encapsulate the (Al, Ga, In)N LEDs 106 and the first shaped optical elements 114.

Figure 15:
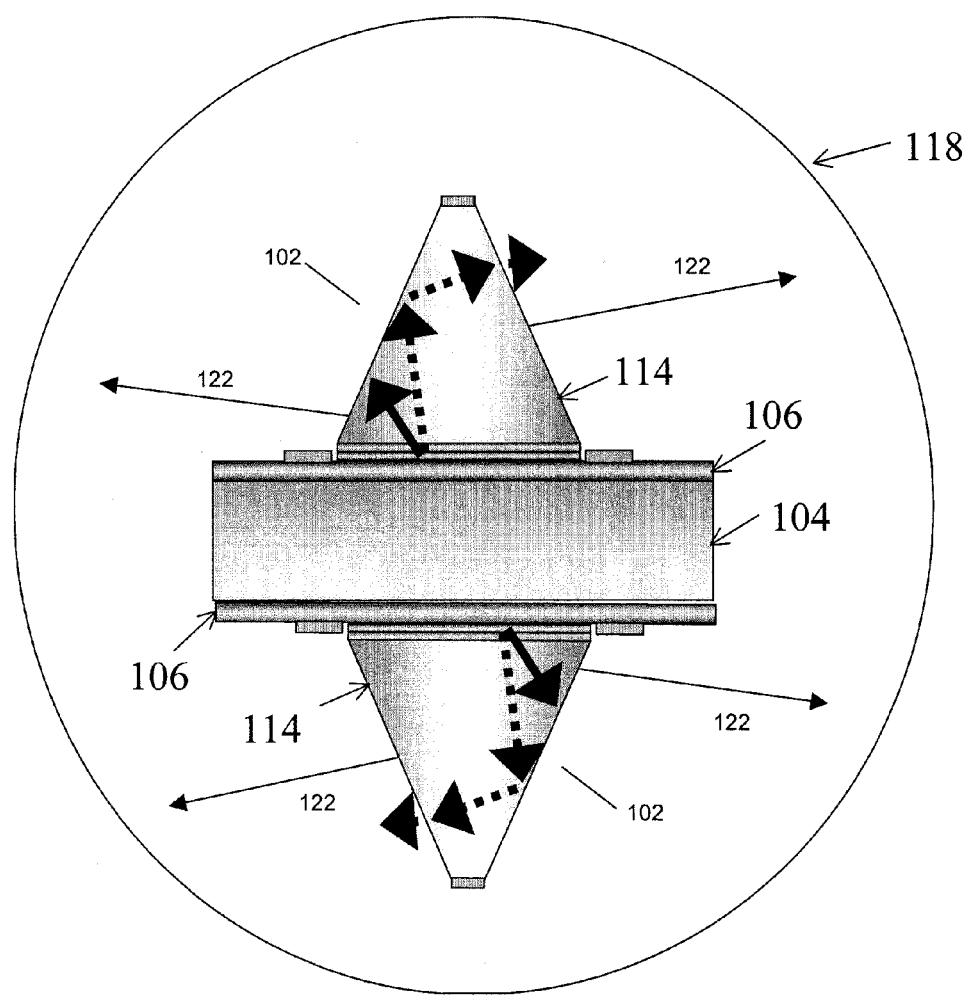
FIG. 15 shows a schematic representation of a multi-shape LED according to the preferred embodiment of the present invention.

FIG. 15 is a schematic representation of an LED according to the preferred embodiment of the present invention. Specifically, a plurality of first "shaped" optical elements (e.g., the n-ZnO cones 114) of higher refractive index are adjacent to, on the surface of, or surrounding one or more (Al, Ga, In)N LEDs 106, wherein one or more second "shaped" optical elements (e.g., the lens 118) of lower refractive index encapsulate the (Al, Ga, In)N LEDs 106 and the first shaped optical elements 114. This embodiment, however, includes first and second n-ZnO cone-shaped elements 114 on both sides of the LED 100. The LEDs 102, and first and second n-ZnO cone-shaped elements 114 are all encapsulated by the lens 118.

Figure 16:
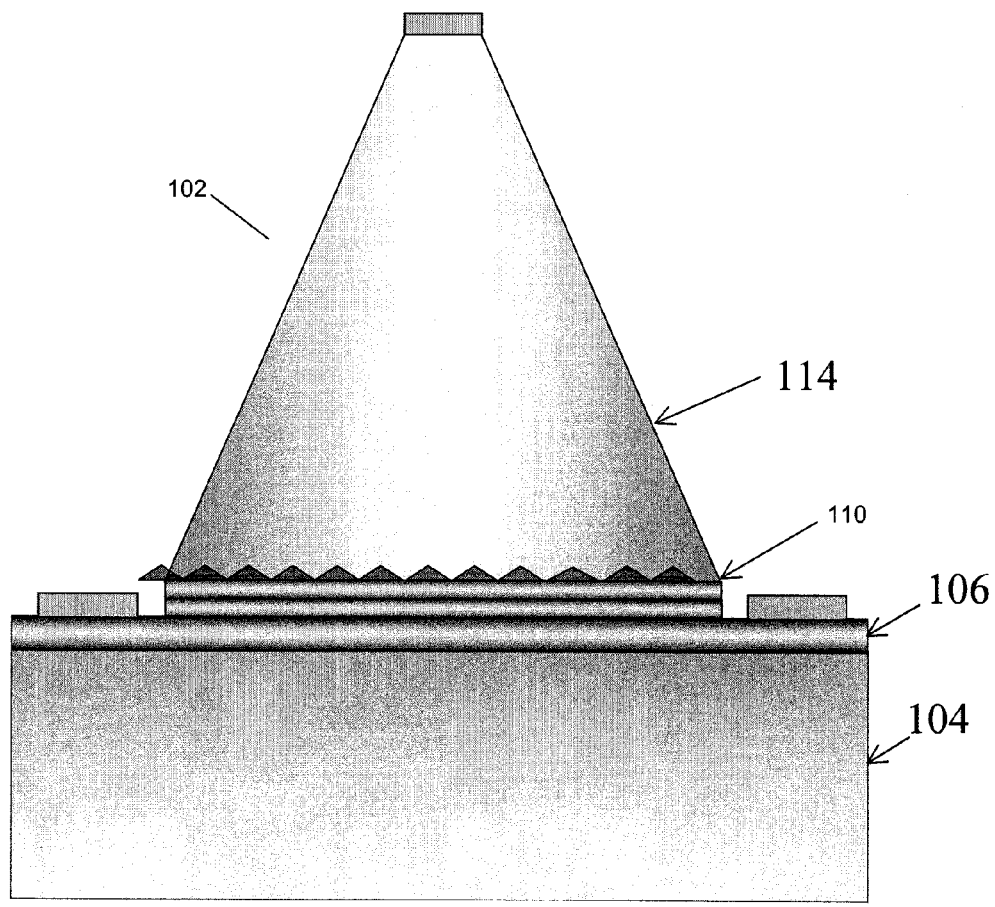
FIG. 16 shows a schematic representation of a high light extraction efficiency LED according to the preferred embodiment of the present invention.

FIG. 16 is a schematic representation of an LED according to the preferred embodiment of the present invention. Specifically, in this embodiment, the p-Gan layer 110 that forms the interface between the LED and the n-ZnO cone 114 may be roughened or shaped to enhance light extraction. This surface roughening may use techniques described in the following related applications: PCT International Application Number PCT/US03/39211, filed Dec. 9, 2003, by Tetsuo Fujii, Yan Gao, Evelyn L. Hu, and Shuji Nakamura, entitled HIGHLY EFFICIENT GALLIUM NITRIDE BASED LIGHT EMITTING DIODES VIA SURFACE ROUGHENING; and U.S. patent application Ser. No. 10/938,704, filed Sep. 10, 2004, by Carole Schwach, Claude C. A. Weisbuch, Steven P. DenBaars, Henri Benisty, and Shuji Nakamura, entitled WHITE, SINGLE OR MULTI-COLOR LIGHT EMITTING DIODES BY RECYCLING GUIDED MODES, which applications are hereby incorporated by reference herein.

Advantages and Improvements

The advantages of the present invention derive from bonding and shaping (Al, Ga, In)N and ZnO LEDs in combination with shaped optical elements designed to extract the light emitting from the LEDs. This combination is novel and has advantages over existing device designs, especially for LED applications.

The III-nitride LED may be comprised of (Al, Ga, In)N materials, (Al, Ga, In)As materials, (Al, Ga, In)P materials, compound semiconductor material from (Al, Ga, In)AsPNSb materials, or compound semiconductor material from $ZnGeN_2$ or $ZnSnGeN_2$ materials.

With regard to the (Al, Ga, In)N materials, the LED may be comprised of c-face {0001} (polar) (Al, Ga, In)N, a-face {11-20}, m-face {1-100} (nonpolar) (Al, Ga, In)N, or (semipolar) (Al, Ga, In)N, wherein semipolar refers to a wide variety of planes that possess two nonzero h, i, or k Miller indices, and a nonzero l Miller index, {hikl}.

In addition, the LED may be grown on a sapphire, silicon carbide, silicon, germanium, gallium arsenide, gallium phosphide, indium phosphide, or spinel wafers, or on gallium nitride, including a free-standing gallium nitride removed from other substrates.

The high refractive index materials may be comprised of many different materials, including ZnO, $TiO_2$, GaN, SiC, SiON, SiN, $SiO_2$, high refractive index metal oxides, high refractive index polymers, or high refractive index plastic material. The low refractive index materials may also be comprised of many different types of materials, including plastics. These materials may be roughened, smoothed or shaped using any number of different methods.

The phosphor may be Cerium(III)-doped YAG (YAG:$Ce^{3+}$, or $Y_3Al_5O_{12}$:$Ce^{3+}$), including $Ce^{3+}$:YAG tuned by substituting the cerium with other rare earth elements such as terbium and gadolinium, or adjusted by substituting some or all of the aluminum in the YAG with gallium.

Although specific angles of A, B, C, D and $\Theta c$ are described herein, those skilled in the art will recognize that these angles of A, B, C, D and $\Theta c$ may be otherwise adjusted to obtain the highest light extraction efficiency.

As noted above, in one embodiment, the LED is comprised of (Al, Ga, In)N layers and the high refractive index light extraction materials are comprised of ZnO layers that are wafer bonded to the (Al, Ga, In)N layers. The ZnO reduces light reflections occurring repeatedly inside the LED, and thus extracts more light out of the LED. The highly transparent characteristic of ZnO reduces light absorption inside an LED. The electrically conductive characteristic of ZnO enables uniform light emitting from the active region in an LED. The resulting external quantum efficiency of this new hybrid GaN/ZnO/shaped lens design should be higher than that of existing GaN-based LED devices.

Moreover, the combination of a transparent ZnO electrode with a nitride LED grown on electrically conductive substrates, such as SiC or GaN, can reduce the number of process steps required for the fabrication of LEDs, because an electrode can be easily formed on the electrically conductive material. However, in other embodiments, the ZnO may be not necessarily wafer bonded, but can be deposited by a wide variety of means.

Finally, with regard to the number of cones, lens or other shaped optical elements, smaller numbers are better, because each cone could absorb the emission from the next cone. When there is only one cone, there are no effects (no absorption) from a next cone (because there is no next cone).

Nonetheless, those skilled in the art will recognize that there may be any number of LEDs, first shaped optical elements and second shaped optical elements arranged in any number of configurations. Further, the LEDs, first shaped optical elements and second shaped optical elements may comprise any number of geometries or shapes and are not restricted to cones, pyramids, etc.

REFERENCES

The following references are incorporated by reference herein:
1. Appl. Phys. Lett. 56, 737-39 (1990).
2. Appl. Phys. Lett. 64, 2839-41 (1994).
3. Appl. Phys. Lett. 81, 3152-54 (2002).
4. Jpn. J. Appl. Phys. 43, L1275-77 (2004).
5. Appl. Phys. Lett. 84, 855 (2004).

CONCLUSION

In summary, the present invention comprises optical devices, usually Light Emitting Diodes (LEDs), that emit multiple wavelengths of light, typically comprising white light. Such devices are usually higher efficiency than comparable devices.

An optical device in accordance with the present invention comprises a III-nitride light emitting region comprised of at least an active region, at least one first shaped optical element wafer bonded to at least one side of the III-nitride light emitting region, at least one second shaped optical element encapsulating both the III-nitride light emitting region and the at least one first shaped optical element for extracting light emitted by the LED and the first shaped optical elements, and a phosphor, optically coupled to the at least one second shaped optical element, wherein light in at least a first wavelength region emitted by the III-nitride light emitting region passes through the at least one second shaped optical elements and excites the phosphor to emit light in at least a second wavelength region.

Such an optical device further optionally includes at least one of the at least one first shaped optical elements comprising a n-type ZnO optical element, at least one of the at least one first shaped optical elements being shaped to increase light extraction from the III-nitride light emitting region, at least one first shaped optical element including angles adjusted for light extraction efficiency from the III-nitride light emitting region, at least one of the at least one first shaped optical elements being cone-shaped and the at least one second shaped optical element comprising a lens.

The optical device can further optionally include the at least one second shaped optical element being shaped for light extraction, the at least one second shaped optical element including angles that are adjusted for light extraction efficiency, a layer forming an interface between the III-nitride light emitting region and the at least one first shaped optical elements having a roughened surface, an additional phosphor layer coupled to the phosphor layer, a third shaped optical element encapsulating the optical device, the at least one first shaped optical elements and the at least one second shaped optical elements for extracting light emitted by the LED, the first shaped optical elements, and the second shaped optical elements, the third shaped optical element comprising a reflector cup, and the phosphor layer being shaped for light extraction efficiency.

The optical device can also include the III-nitride light emitting layer comprises at least one of the group consisting of: (Al, Ga, In)N materials, (Al, Ga, In)As materials, (Al, Ga, In)P materials, compound semiconductor material from (Al, Ga, In)AsPNSb materials, and compound semiconductor material from $ZnGeN_2$ or $ZnSnGeN_2$ materials, a reflective coating coupled to the at least one first optical element, a reflector positioned between the phosphor layer and the III-nitride light emitting region which passes at least the first wavelength region and reflects at least a portion of light in the second wavelength region, and the reflector being a distributed Bragg reflector.

Another embodiment of the present invention is a Light Emitting Diode assembly. Such an assembly in accordance with the present invention comprises a substrate, a light emitting device, comprising an n-type Group III nitride layer coupled to the substrate, an active layer, coupled to the n-type Group III nitride layer, wherein the active layer emits light in at least a first wavelength region, and a p-type Group III nitride layer, coupled to the active layer, at least one oxide layer, coupled to the light emitting device, the at least one oxide layer being shaped into a form that increases the efficiency of the light emitting device by reducing light absorption in the light emitting device, an optical element, coupled to the at least one oxide layer, and a phosphor, optically coupled to the at least one oxide layer, wherein light in at least the first wavelength region emitted by the light emitting device passes through the phosphor and excites the phosphor to emit light in at least a second wavelength region.

Another embodiment of the present invention is a Light Emitting Diode (LED) emitting multiple wavelength regions of light, which comprises an active Group III nitride layer, wherein the active Group III nitride layer emits light in at least a first wavelength region, at least one oxide layer, coupled to the light emitting device, wherein the at least one oxide layer is substantially transparent in the first wavelength region, the at least one oxide layer being shaped into a form that increases the efficiency of the LED by reducing light absorption in the LED, and a phosphor, optically coupled to the at least one oxide layer such that light in at least the first wavelength region strikes the phosphor and excites the phosphor to emit light in at least a second wavelength region, such that light in at least the first wavelength region and the second wavelength region are emitted by the LED.

Such an embodiment further optionally includes a lens, coupled between the oxide layer and the phosphor, wherein the lens increases the efficiency of the LED by reducing light absorption in the LED.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optical device, comprising:
    a light emitting device comprised of at least an n-type layer having an n-type electrode, an active region, a p-type layer, and an n-type ZnO layer bonded to the p-type layer, wherein the n-type ZnO layer comprises at least one first shaped optical element for extracting light emitted by the active region, the first shaped optical element is shaped as a cone, a p-type electrode is placed on top of the cone, and the cone's base is bonded to the p-type layer;
    at least one second shaped optical element comprising a conical lens encapsulating both the light emitting device and the at least one first shaped optical element for extracting light emitted by the active region and the first shaped optical elements; and
    a phosphor, optically coupled to the at least one second shaped optical element, wherein light in at least a first wavelength region emitted by the active region passes through the at least one second shaped optical elements and excites the phosphor to emit light in at least a second wavelength region.

2. The optical device of claim 1, wherein the at least one first optical element is wafer bonded to the light emitting device.

3. The optical device of claim 1, wherein at least one of the at least one first shaped optical elements comprises a ZnO optical element.

4. The optical device of claim 1, wherein at least one of the at least one first shaped optical elements is shaped to increase light extraction from the active region.

5. The optical device of claim 1, wherein the at least one first shaped optical elements include angles adjusted for light extraction efficiency from the active region.

6. The optical device of claim 1, wherein the at least one second shaped optical element is shaped for light extraction.

7. The optical device of claim 1, wherein the at least one second shaped optical element includes angles that are adjusted for light extraction efficiency.

8. The optical device of claim 1, wherein a layer that forms an interface between the active region and the at least one first shaped optical elements has a roughened surface.

9. The optical device of claim 1, further comprising an additional phosphor layer coupled to the phosphor layer.

10. The optical device of claim 1, further comprising a third shaped optical element encapsulating the active region, the at least one first shaped optical elements and the at least one second shaped optical elements for extracting light emitted by the active region, the first shaped optical elements, and the second shaped optical elements.

11. The optical device of claim 10, wherein the third shaped optical element comprises a reflector cup.

12. The optical device of claim 1, wherein the phosphor layer is shaped for light extraction efficiency.

13. The optical device of claim 1, wherein the light emitting device comprises at least one of the group consisting of: (Al, Ga, In)N materials, (Al, Ga, In)As materials, (Al, Ga, In)P materials, compound semiconductor material from (Al, Ga, In)AsPNSb materials, and compound semiconductor material from $ZnGeN_2$ or $ZnSnGeN_2$ materials.

14. The optical device of claim 1, further comprising a reflective coating coupled to the at least one first optical element.

15. The optical device of claim 1, further comprising a reflector positioned between the phosphor layer and the active region which passes at least the first wavelength region and reflects at least a portion of light in the second wavelength region.

16. The optical device of claim 15, wherein the reflector is a distributed Bragg reflector.

17. A Light Emitting Diode (LED) assembly, comprising:
    a substrate;
    a light emitting device, comprising:
        an n-type Group III nitride layer formed on the substrate;
        an active layer, formed on the n-type Group III nitride layer, wherein the active layer emits light in at least a first wavelength region;
        a p-type Group III nitride layer, formed on the active layer; and
        at least one n-type oxide layer, bonded to the p-type Group-III nitride layer, for extracting light emitted by the active layer, the at least one n-type oxide layer being shaped into a cone that increases the efficiency of the light emitting device by reducing internal reflection of the light in the light emitting device, wherein a p-type electrode is placed on top of the cone, and the cone's base is bonded to the p-type Group-III nitride layer;
    an optical element, optically coupled to the at least one n-type oxide layer, for extracting light emitted by the active layer, the optical element being shaped into a conical lens and encapsulating both the light emitting device and the at least one n-type oxide layer; and
    a phosphor, optically coupled to the at least one n-type oxide layer, wherein light in at least the first wavelength region emitted by the light emitting device passes through the phosphor and excites the phosphor to emit light in at least a second wavelength region.

18. The LED of claim 17, wherein the lens increases the efficiency of the LED by reducing light absorption in the LED.

19. The LED of claim 17, wherein the oxide layer is an electrode for the LED.

20. The LED of claim 19, further comprising a contact on top of the oxide layer.

21. The LED of claim 20, wherein the contact is p-type and the oxide layer is n-type.

22. The LED of claim 19, wherein the oxide layer is Zinc Oxide (ZnO), the cone is an etched cone, and the ZnO is wafer-bonded to the light emitting device comprising Group III nitride layers.

23. The LED of claim 22, wherein the phosphor is in a layer, a lower surface of the layer facing the LED is smooth and the phosphor is shaped on an outer surface of the layer.

24. A Light Emitting Diode (LED) emitting multiple wavelength regions of light, comprising:
    an n-type Group III nitride layer;
    an active Group III nitride layer formed on or above the n-type Group III nitride layer, wherein the active Group III nitride layer emits light in at least a first wavelength region;
    a p-type Group III nitride layer formed on or above the active Group III nitride layer;
    at least one n-type oxide layer, bonded to the p-type Group III nitride layer, for extracting light emitted by the active layer, wherein the at least one n-type oxide layer is substantially transparent in the first wavelength region, the at least one n-type oxide layer being shaped into a cone that increases the efficiency of the LED by reducing internal reflection of the light in the LED, a p-type electrode being placed on top of the cone, and the cone's base being bonded to the p-type Group III nitride layer;
    a conical lens, encapsulating both the active Group III nitride layer and the n-type oxide layer, wherein the lens increases the efficiency of the LED by reducing light absorption in the LED; and
    a phosphor, optically coupled to the at least one n-type oxide layer such that light in at least the first wavelength region strikes the phosphor and excites the phosphor to emit light in at least a second wavelength region, such that light in at least the first wavelength region and the second wavelength region are emitted by the LED.

* * * * *